US008773931B2

(12) United States Patent
Chang et al.

(10) Patent No.: US 8,773,931 B2
(45) Date of Patent: Jul. 8, 2014

(54) METHOD OF DETECTING CONNECTION DEFECTS OF MEMORY AND MEMORY CAPABLE OF DETECTING CONNECTION DEFECTS THEREOF

(75) Inventors: Min-Chih Chang, Hsinchu (TW); Shih-Hsing Wang, Hsinchu (TW); Te-Yi Yu, New Taipei (TW); Lien-Sheng Yang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 151 days.

(21) Appl. No.: 13/525,372

(22) Filed: Jun. 18, 2012

(65) Prior Publication Data
US 2013/0010558 A1   Jan. 10, 2013

(30) Foreign Application Priority Data
Jul. 6, 2011 (TW) .............................. 100123823 A

(51) Int. Cl.
G11C 7/00 (2006.01)
G11C 29/02 (2006.01)
G11C 29/12 (2006.01)
G11C 29/50 (2006.01)

(52) U.S. Cl.
CPC ...... G11C 29/025 (2013.01); G11C 2029/1202 (2013.01); G11C 2029/5006 (2013.01)
USPC .......................................................... 365/201

(58) Field of Classification Search
USPC .......................................................... 365/201
See application file for complete search history.

(56) References Cited

U.S. PATENT DOCUMENTS

| 5,748,545 A * | 5/1998 | Lee et al. ................... 365/201 |
| 6,201,747 B1 | 3/2001 | Venkatesh |
| 6,370,061 B1 | 4/2002 | Yachareni |
| 2003/0185063 A1 * | 10/2003 | Yang ........................... 365/200 |
| 2012/0008384 A1 * | 1/2012 | Li et al. .................... 365/185.2 |
| 2012/0008410 A1 * | 1/2012 | Huynh et al. ........... 365/185.21 |
| 2012/0281479 A1 * | 11/2012 | Kochar et al. .......... 365/185.19 |
| 2013/0229868 A1 * | 9/2013 | Koh et al. ............... 365/185.03 |

FOREIGN PATENT DOCUMENTS

TW   I326452   6/2010

* cited by examiner

*Primary Examiner* — Hoai V Ho
(74) *Attorney, Agent, or Firm* — Winston Hsu; Scott Margo

(57) ABSTRACT

By inputting voltages to global word lines of a memory, and by detecting currents of corresponding global word lines, a relation function between the currents and the voltages can be generated, and connection defects on the global word lines can be determined according to various types of deviation of a relation curve corresponding to the relation function between the currents and voltages.

17 Claims, 8 Drawing Sheets

METHOD OF DETECTING CONNECTION DEFECTS OF MEMORY AND MEMORY CAPABLE OF DETECTING CONNECTION DEFECTS THEREOF

BACKGROUND OF THE INVENTION

1. Field of the Invention

The present invention discloses a method of detecting connection defects in a memory and a memory capable of detecting connection defects thereof, and more particularly, a method and a memory for detecting connection defects in the memory according to relations between input voltages on global word lines and corresponding currents.

2. Description of the Prior Art

Please refer to FIG. 1, which illustrates connection defects occurring on word lines of a conventional memory. In FIG. 1, there are two neighboring sub word line drivers M1 and M2 included by a same memory, wherein the sub word line driver M1 includes a P-type MOSFET P1 and an N-type MOSFET N1, and the sub word line driver M2 includes a P-type MOSFET P2 and an N-type MOSFET N2. The sub word line drivers M1 and M2 are respectively biased by a voltage source Vpp and a ground GND. The sub word line driver M1 is connected to a first sub word line W1, and the sub word line driver M2 is connected to a second sub word line W2.

As shown in FIG. 1, when gates of the P-type MOSFET P1 and the N-type MOSFET N1 are connected to a low-voltage-level input signal provided by a decoder, and when gates of the P-type MOSFET P2 and the N-type MOSFET N2 are connected to a high-voltage-level input signal provided by the decoder, a high voltage level occurs on the first sub word line W1, and a low voltage level occurs on the second sub word line W2, where a symbol L indicates a low voltage level in FIG. 1, and a symbol H indicates a high voltage level in FIG. 1.

However, when there is a connection defect, i.e. a short circuit, between the first sub word line W1 and the second sub word line W2, so that a DC leakage path is introduced, as shown in FIG. 1, the low voltage level previously on the second sub word line W2 will be replaced by the high voltage level on the first sub word line W1, and it will introduce errors in operations of the memory. The errors worsen when more DC leakage paths are introduced between sub word lines of the memory, tending to lead to reduced accuracy of operations of the memory.

SUMMARY OF THE INVENTION

The claimed invention discloses a method of detecting connection defects in a memory. The memory comprises a plurality of first global word lines and a plurality of second global word lines. The method comprises providing a plurality of first voltages having different voltage levels to each of the plurality of first global word lines at a first moment, where each of the first voltages is simultaneously provided to the plurality of first global word lines; providing a second voltage to the plurality of second global word lines at the first moment; measuring a plurality of first currents occurred on each of the plurality of first global word lines when the plurality of first voltages are provided to the plurality of first global word lines; and determining whether there are connection defects on the plurality of first global word lines according to relations between the plurality of first currents and the plurality of first voltages.

The claimed invention discloses a memory capable of detecting connection defects. The memory comprises a plurality of first global word lines, a plurality of second global word lines, a controlling unit, a current detecting unit, and a processing unit. The controlling unit is coupled to an external power source, the plurality of first global word lines, and the plurality of second global word lines, for providing a plurality of first voltages having different voltage levels to each of the plurality of first global word lines at a first moment, and for providing a second voltage to the plurality of second global word lines at the first moment. Each of the first voltages is simultaneously provided to the plurality of first global word lines. The current detecting unit is coupled to the plurality of first global word lines, for measuring a plurality of first currents occurred on each of the plurality of first global word lines when the plurality of first voltages are provided to the plurality of first global word lines. The processing unit is utilized for determining whether there are connection defects on the plurality of first global word lines according to relations between the plurality of first currents and the plurality of first voltages.

These and other objectives of the present invention will no doubt become obvious to those of ordinary skill in the art after reading the following detailed description of the preferred embodiment that is illustrated in the various figures and drawings.

DETAILED DESCRIPTION

For effectively detecting connection defects introducing DC leakage paths between word lines of a memory so as to maintain accuracy of operations of the memory, the present invention discloses a method and a memory for detecting connection defects of global word lines of the memory. In the memory, a single global word line is utilized for simultaneously managing a plurality of sub word lines; therefore, detecting connection defects in global word lines is more effective than detecting connection defects in sub word lines.

Figure 2:
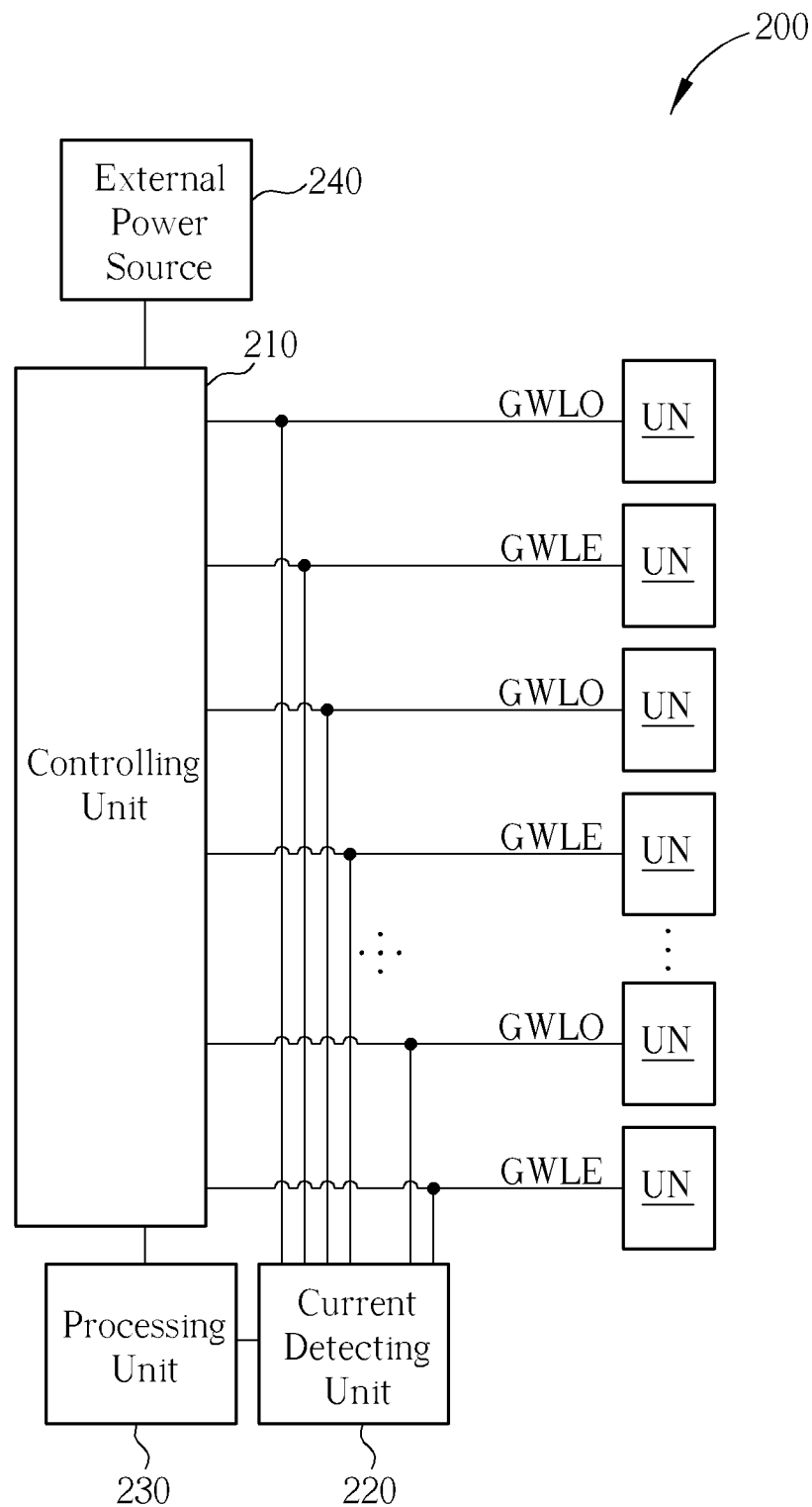
FIG. 2 illustrates a block diagram of a memory capable of detecting connection defects on global word lines, according to one embodiment of the present invention.

Please refer to FIG. 2, which illustrates a block diagram of a memory 200 capable of detecting connection defects on global word lines according to one embodiment of the present invention. As shown in FIG. 2, the memory 200 includes at least a plurality of odd global word lines GWLO, a plurality of even global word lines GWLE, a plurality of memory modules UN, a controlling unit 210, a current detecting unit 220, a processing unit 230, and an external power source 240. Each of the global word lines GWLO or GWLE is coupled to one row of memory modules UN.

Figure 1:
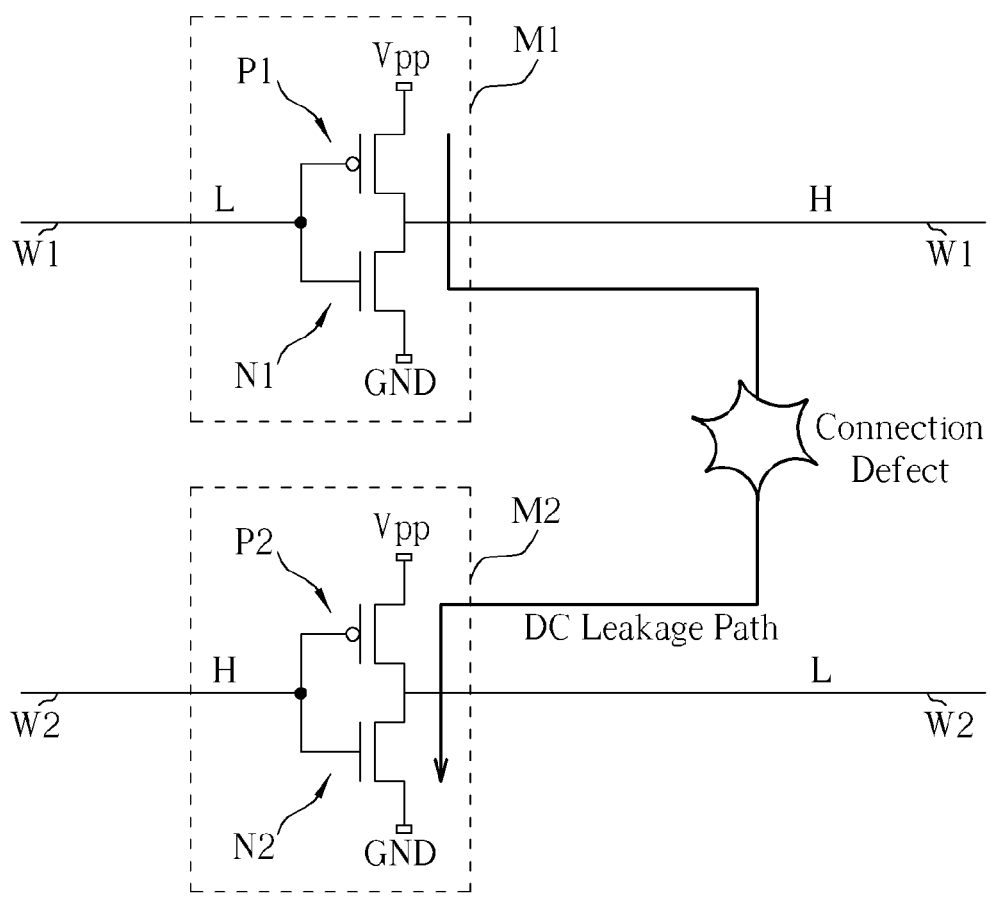
FIG. 1 illustrates connection defects occurred on word lines of a conventional memory.
Figure 3:
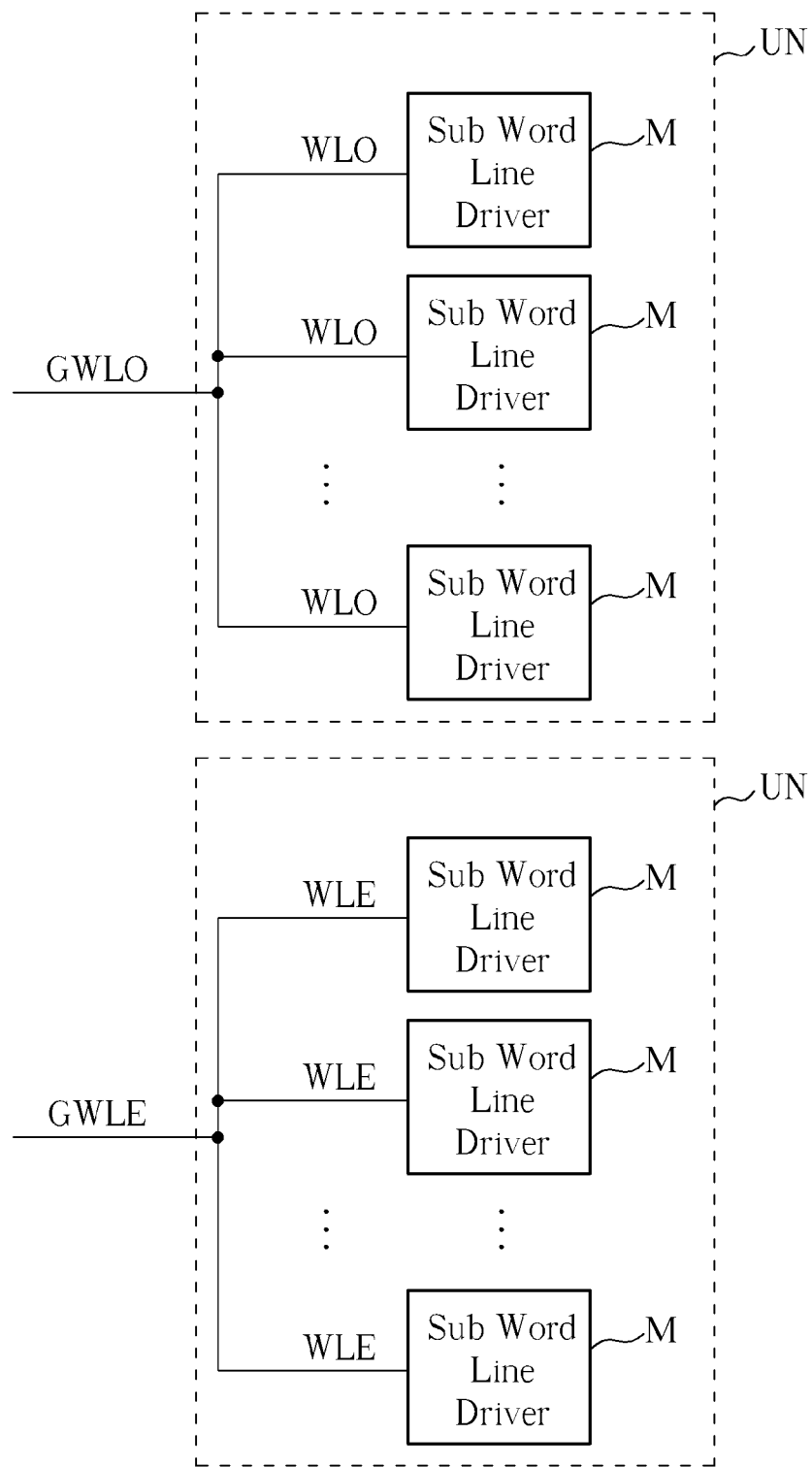
FIG. 3 schematically illustrates two neighboring memory modules UN respectively belonging to two neighboring rows in the memory shown in FIG. 2.

Please refer to FIG. 3, which schematically illustrates two neighboring memory modules UN respectively belonging to two neighboring rows in the memory 200, where one of the memory modules UN is coupled to an odd global word line GWLO, and the other one of the memory modules UN is coupled to an even global word line GWLE. The odd global word line GWLO is configured to manage a plurality of sub word lines WLO, and the even global word line GWLE is configured to manage a plurality of sub word lines WLE. Each of the sub word lines WLO and WLE is configured to manage a sub word line driver M, which may share similar elements and a similar structure to the sub word line drivers M1 and M2 shown in FIG. 1.

The controlling unit 210 is coupled to the external power source 240, the plurality of odd global word lines GWLO, and the plurality of even global word lines GWLE, and is configured to provide voltages to the plurality of odd global word lines GWLO and the plurality of even global word lines GWLE. The current detecting unit 220 is coupled to the plurality of odd global word lines GWLO and the plurality of even global word lines GWLE, and is configured to detect currents occurring in response to the voltages provided to the plurality of odd global word lines GWLO and the plurality of even global word lines GWLE. The processing unit 230 is utilized for determining whether there are connection defects on the plurality of odd global word lines GWLO and the plurality of even global word lines GWLE according to relations between the provided voltages and the occurring currents on the plurality of odd global word lines GWLO and the plurality of even global word lines GWLE. The external power source is utilized for providing a voltage required by the controlling unit 210.

How the memory 200 detects connection defects on the plurality of odd global word lines GWLO and the plurality of even global word lines GWLE is described as follows.

First, the controlling unit 210 simultaneously provides a plurality of first voltages having different voltage levels to the plurality of odd global word lines GWLO at a first moment, so that the provided first voltages on each of the global word lines GWLO may swing; the controlling unit 210 further provides a second voltage to a plurality of even global word lines GWLE simultaneously at the first moment, where each of the first voltages is higher than the second voltage. Then, the current detecting unit 220 detects currents occurring on the plurality of odd global word lines GWLO in correspondence with the plurality of first voltages. The processing unit 230 retrieves information about the plurality of first voltages from the controlling unit 210, and retrieves information about the currents occurring in correspondence with the plurality of first voltages from the current detecting unit 220. Therefore, the processing unit 230 is capable of determining relation functions between a current and a first voltage on each of the global word lines according to the retrieved information.

Figure 4:
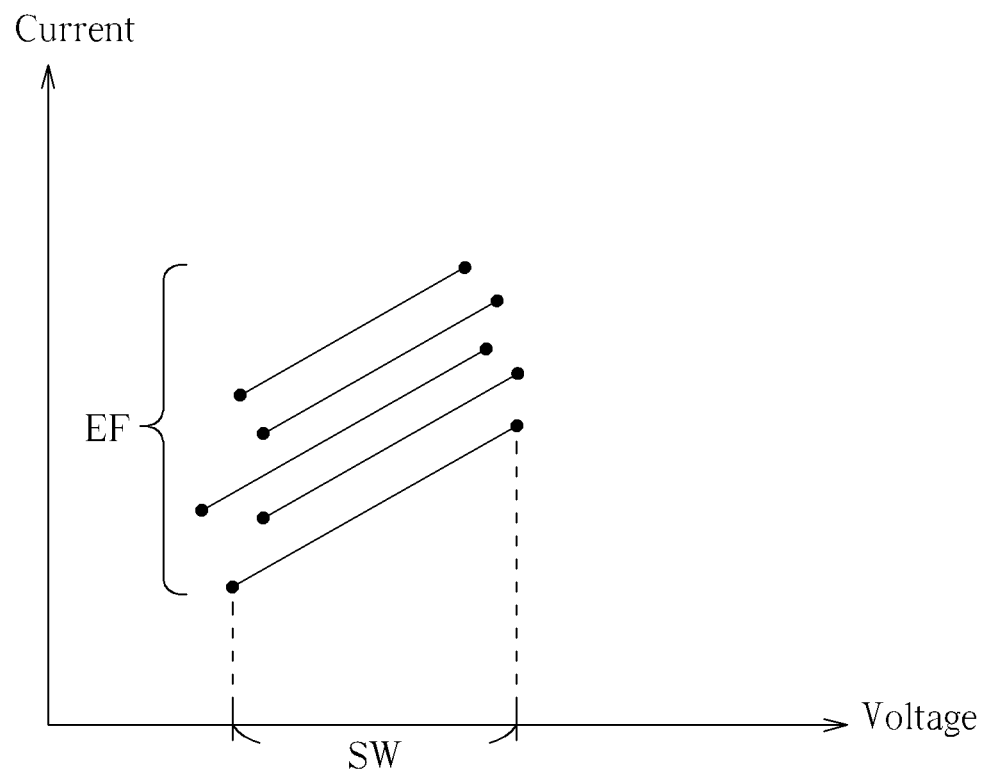
FIG. 4 illustrates relation curves between the provided plurality of first voltages on the odd global word lines GWLO and the currents occurred correspondingly.

Please refer to FIG. 4, which illustrates relation curves between the provided plurality of first voltages on the odd global word lines GWLO and the currents occurring correspondingly. A set of relation curves EF are determined by the processing unit 230, as shown in FIG. 4, and there are no connection defects on the set of relation curves EF. Each of the relation curves EF is corresponding to a single odd global word line GWLO. A voltage swing region SW shown in FIG. 4 indicates an example of measuring occurring currents on a single global word line GWLO. Since there are differences in voltage levels of the provided plurality of first voltages, a starting point of each of the relation curves EF, i.e. the lowest voltage at each of the relation curves EF, may vary slightly. However, under the assumption that there are no connection defects on each of the odd global word lines GWLO, slopes of the plurality of relation curves EF may be close to or equal to each other, as shown in FIG. 4. In other embodiments of the present invention, the controlling unit 210 may detect all global word lines in the memory chip for connection defects, or detect part of the global word lines in the memory chip for connection defects. When the controlling unit 210 merely detects part of the global word lines, the plurality of first voltages are merely provided to the part of the global word lines. Therefore, under different conditions for detecting connection defects, each of the relation curves EF shown in FIG. 4 may correspond to a plurality of odd global word lines GWLO of a memory section, a memory bank, or a memory chip.

Figure 5:
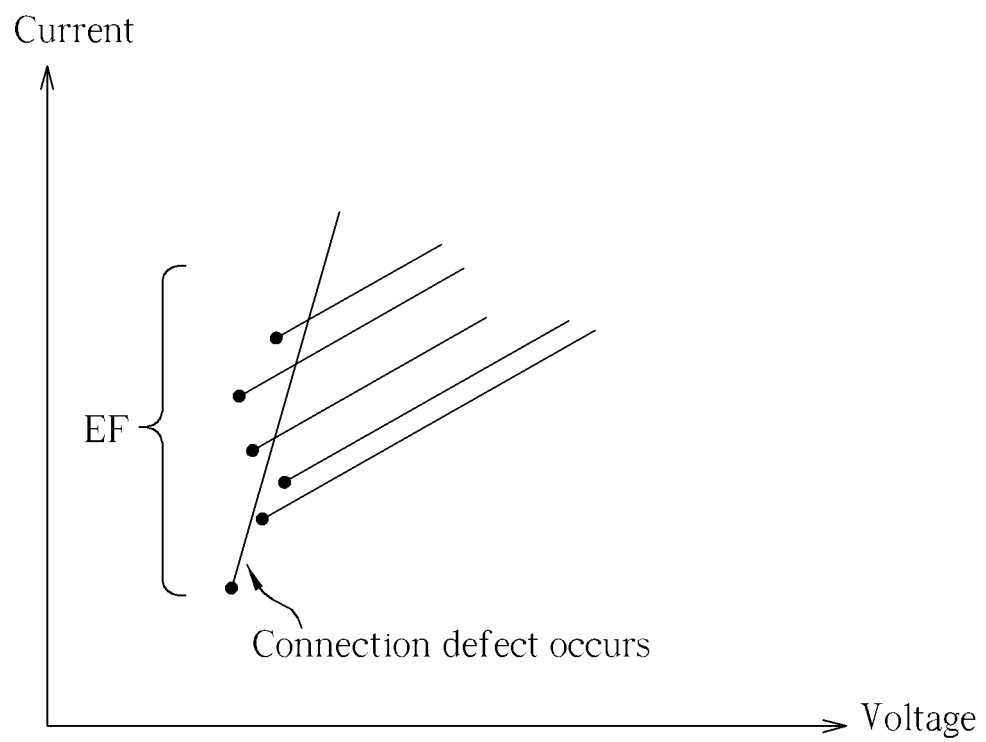
FIG. 5 illustrates how to determine whether there is a connection defect on a global word line according to whether a slope of a relation curve of the global word line varies significantly from that of relation curves of other global word lines, according to one embodiment of the present invention.

However, when there are connection defects in certain odd global word lines GWLO, slopes of the certain odd global word lines GWLO may vary significantly from those of other odd global word lines GWLO having no connection defects. Please refer to FIG. 5, which illustrates how to determine whether there is a connection defect on a global word line according to whether a slope of a relation curve of the global word line varies significantly from that of relation curves of other global word lines. As shown in FIG. 5, there is a relation curve EF having a significantly different slope from others among the set of relation curves EF. The processing unit 230 may determine a predetermined deviation; when the relation curve having a significantly different slope indicates a deviation larger than the predetermined deviation, the processing unit 230 may determine that there is at least one connection defect on a global word line GWLO corresponding to the relation curve having the significantly different slope.

Figure 6:
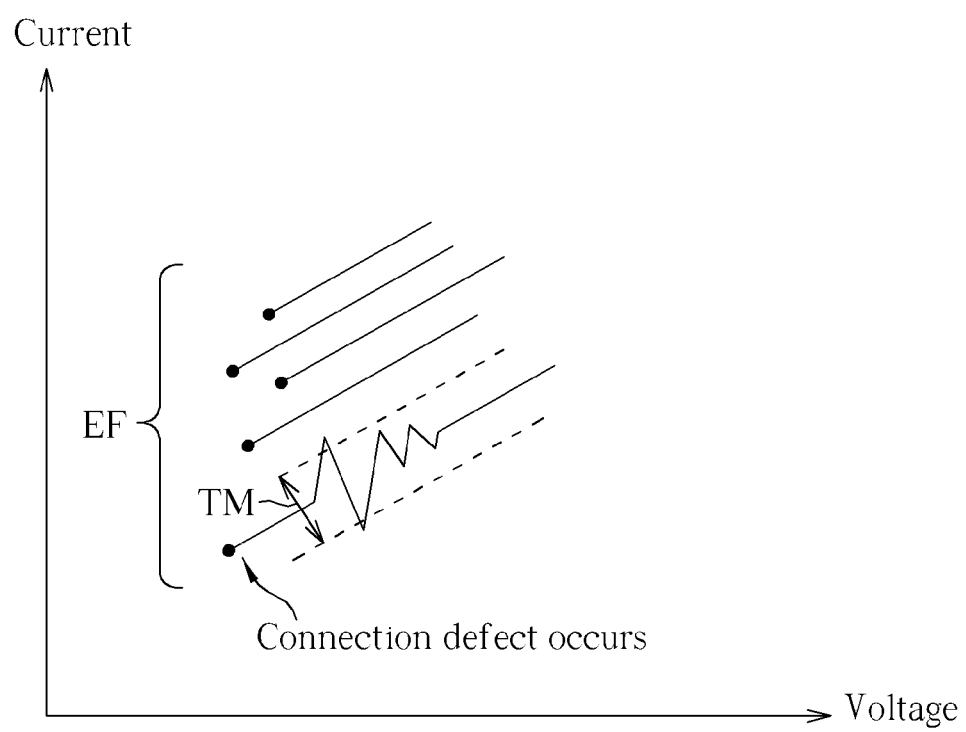
FIG. 6 illustrates how to determine connection defects on global word lines according to deviations of relation curves shown in FIG. 4.

Besides slope deviation, deviation of relation curves may also be utilized as a reference for determining whether there are connection defects on global word lines. Please refer to FIG. 6, which illustrates how to determine connection defects on global word lines according to deviations of relation curves shown in FIG. 4. Among the relation curves EF shown in FIG. 6, there is one relation curve having a similar slope as the others but having a significantly larger deviation from the others. The processing unit 230 may determine a predetermined deviation TM. When the deviation of the relation curve is larger than the predetermined deviation TM, as shown in FIG. 6, the processing unit 230 may determine that there is at least one connection defect on a global word line GWLO corresponding to the relation curve having the larger deviation.

Figure 7:
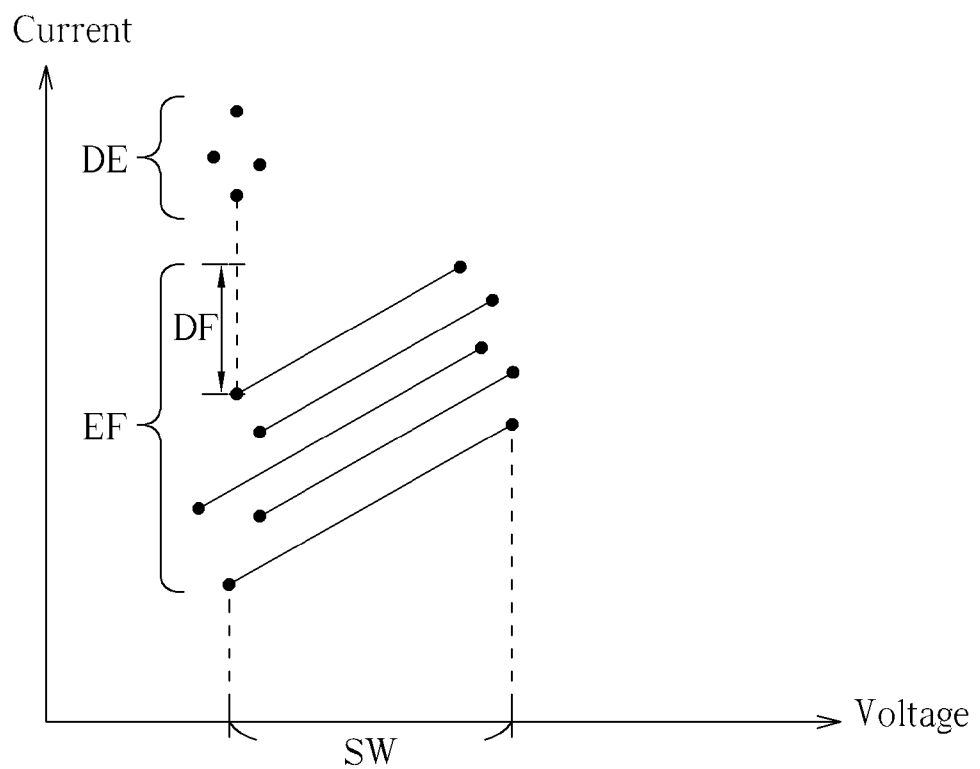
FIG. 7 illustrates how to determine whether there are connection defects on global word lines according to deviations of starting points of relation curves shown in FIG. 4.

In another embodiment of the present invention, deviation of a starting point of a relation curve may be utilized for determining whether there are connection defects on a global word line corresponding to the relation curve. Please refer to FIG. 7, which illustrates how to determine whether there are connection defects on global word lines according to deviations of starting points of relation curves shown in FIG. 4. As shown in FIG. 7, besides a first group of relation curves EF having starting points close to each other, there are a second group of deviation points DE having voltages close to starting points of the first group of relation curves EF but having much larger currents than starting points of the first group of relation curves EF. The much larger currents are introduced by DC paths caused by connection defects, and each of the deviation points DE corresponds to at least one global word line having at least one connection defect. In one embodiment of the present invention, a predetermined value, e.g. a predetermined current deviation DF shown in FIG. 7, may be determined in advance; therefore, when a voltage is inputted to a global word line, and when an initial current occurring on a relation curve of the global word line deviates significantly from those of relation curves of most other global word lines, a fact that at least one connection defect exists on the global word line can be determined without further swinging the voltages on the global word line.

In one embodiment of the present invention, as long as at least one of the conditions, including a highly-deviated slope, a highly-deviated curve, and a highly-deviated initial value, is met, a fact that at least one connection defect exists on a corresponding global word line can be determined.

In embodiments shown in FIGS. 4-7, the abovementioned detecting method can also be utilized for detecting connection defects on even global word lines GWLE, as long as a plurality of fourth voltages having different voltage levels are provided to the plurality of even global word lines GWLE, and as long as a third voltage is provided to the plurality of odd global word lines GWLO at the same time, where each of the plurality of fourth voltages is higher than the third voltage.

Note that the step of detecting connection defects on the plurality of odd global word lines GWLO is completed at once, instead of respectively detecting the plurality of odd global word lines GWLO at different and exclusive time intervals. Similarly, the step of detecting connection defects on the plurality of even global word lines GWLE is also completed at once. While implementing the procedure of detecting connection defects on global word lines by following the above descriptions and using the memory 200, the plurality of odd global word lines GWLO are detected at once, and the plurality of even global word lines GWLE are then detected at once according to one embodiment of the present invention; else, the plurality of even global word lines GWLE are detected at once, and the plurality of odd global word lines GWLO are then detected at once according to another embodiment of the present invention. No matter which set of global word lines is detected first, all connection defects on global word lines of the memory 200 can be detected in merely two attempts of detection, and the memory 200 can be adjusted immediately in response to all detected connection defects. Accuracy of operations of and access to the memory 200 can be raised as a result of the adjustment on the memory 200, so that the problem of bad accuracy of the conventional memory is neutralized.

In one embodiment of the present invention, while implementing the detecting method, sub word lines managed by each of the global word lines can be offline or open-circuited, so that noise from the sub word lines can be prevented while the current detecting unit 220 detects currents occurring on global word lines, and so that resolution of measuring the occurring currents on the global word lines is raised.

Figure 8:
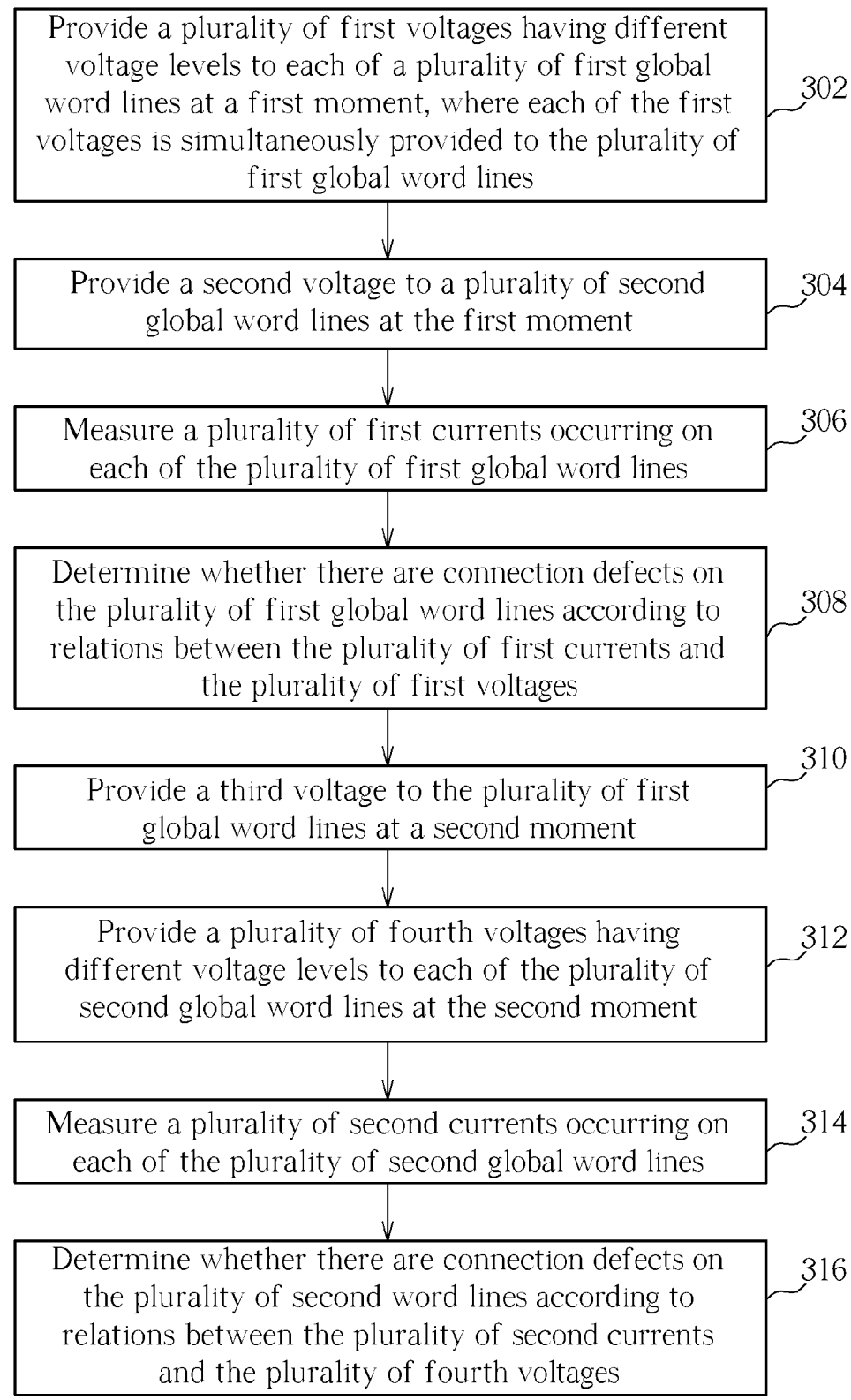
FIG. 8 illustrates a flowchart of detecting connection defects according to one embodiment of the present invention.

Please refer to FIG. 8, which illustrates a flowchart of detecting connection defects according to one embodiment of the present invention. As shown in FIG. 8, the detecting method includes steps as follows:

Step 302: Provide a plurality of first voltages having different voltage levels to each of a plurality of first global word lines at a first moment, where each of the first voltages is simultaneously provided to the plurality of first global word lines.

Step 304: Provide a second voltage to a plurality of second global word lines at the first moment.

Step 306: Measure a plurality of first currents occurring on each of the plurality of first global word lines when the plurality of first voltages are provided to the plurality of first global word lines.

Step 308: Determine whether there are connection defects on the plurality of first global word lines according to relations between the plurality of first currents and the plurality of first voltages.

Step 310: Provide a third voltage to the plurality of first global word lines at a second moment.

Step 312: Provide a plurality of fourth voltages having different voltage levels to each of the plurality of second global word lines at the second moment, where each of the fourth voltages is simultaneously provided to the plurality of second global word lines.

Step 314: Measure a plurality of second currents occurring on each of the plurality of second global word lines, when the plurality of fourth voltages are provided to the plurality of second global word lines.

Step 316: Determine whether there are connection defects on the plurality of second word lines according to relations between the plurality of second currents and the plurality of fourth voltages.

The procedure of detecting connection defects on odd global word lines GWLO is indicated by Steps 302-308, and the procedure of detecting connection defects on even global word lines GWLE is indicated by Steps 310-316. However, in other embodiments of the present invention, Steps 302-308 may also be applied for detecting connection defects on the even global word lines GWLE, and Steps 310-316 may also be applied for detecting connection defects on the odd global word lines GWLO. Embodiments formed by reasonable combination and permutation of the steps shown in FIG. 8, or by adding limitations mentioned above, should also be regarded as embodiments of the present invention.

The present invention discloses a detecting method and a memory for detecting connection defects, so that the memory is capable of monitoring all its connection defects and of adjusting itself for preserving the accuracy of its operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of detecting connection defects in a memory, the memory comprising a plurality of first global word lines and a plurality of second global word lines, the method comprising:

providing a plurality of first voltages having different voltage levels at a same time to the plurality of first global word lines respectively at a first moment during a detection period, wherein each of the first voltages is simultaneously provided to the plurality of first global word lines;

providing a second voltage to the plurality of second global word lines at the first moment;

measuring a plurality of first currents occurring on each of the plurality of first global word lines when the plurality of first voltages are provided to the plurality of first global word lines; and determining whether there are connection defects on the plurality of first global word lines according to relations between the plurality of first currents and the plurality of first voltages.

2. The method of claim 1 wherein determining whether there are connection defects on the plurality of first global word lines according to the relations between the plurality of first currents and the plurality of first voltages comprises one of the following steps:

determining whether there are connection defects on the plurality of first global word lines according to whether a slope of a relation curve formed by the plurality of first currents and the plurality of first voltages is higher than a predetermined slope;

determining whether there are connection defects on the plurality of first global word lines according to whether a deviation of the relation curve formed by the plurality of first currents and the plurality of first voltages exceeds a predetermined range; and determining whether there are connection defects on the plurality of first global word lines according to whether an initial value of the relation curve formed by the plurality of first currents and the plurality of first voltages exceeds a predetermined value.

3. The method of claim 1, wherein the plurality of first voltages are higher than the second voltage.

4. The method of claim 1, further comprising:

stopping providing power to a plurality of first sub word lines corresponding to each of the plurality of first global word lines and to a plurality of second sub word lines corresponding to each of the plurality of second global word lines.

5. The method of claim 1, further comprising:

providing a third voltage to the plurality of first global word lines at a second moment;

providing a plurality of fourth voltages having different voltage levels to each of the plurality of second global word lines at the second moment, wherein each of the fourth voltages is simultaneously provided to the plurality of second global word lines;

measuring a plurality of second currents occurring on each of the plurality of second global word lines when the plurality of four voltages are provided to the plurality of second global word lines; and determining whether there are connection defects on the plurality of second word lines according to relations between the plurality of second currents and the plurality of fourth voltages.

6. The method of claim 5, wherein determining whether there are connection defects on the plurality of second word lines according to the relation between the plurality of second currents and the plurality of fourth voltages comprises one of the following steps:

determining whether there are connection defects on the plurality of second global word lines according to whether a slope of a relation curve formed by the plurality of second currents and the plurality of fourth voltages is higher than a predetermined slope;

determining whether there are connection defects on the plurality of second global word lines according to whether a deviation of the relation curve formed by the plurality of second currents and the plurality of fourth voltages exceeds a predetermined range; and determining whether there are connection defects on the plurality of second global word lines according to whether an initial value of the relation curve formed by the plurality of second currents and the plurality of fourth voltages exceeds a predetermined value.

7. The method of claim 5, wherein the plurality of fourth voltages are higher than the third voltage.

8. The method of claim 1, wherein the plurality of first global word lines are a plurality of odd global word lines, and the plurality of second global word lines are a plurality of even global word lines; or wherein the plurality of first global word lines are a plurality of even global word lines, and the plurality of second global word lines are a plurality of odd global word lines.

9. A memory capable of detecting connection defects, comprising:

a plurality of first global word lines;

a plurality of second global word lines;

a controlling unit coupled to an external power source, the plurality of first global word lines, and the plurality of second global word lines for providing a plurality of first voltages having different voltage levels at a same time to the plurality of first global word lines respectively at a first moment during a detection period, and for providing a second voltage to the plurality of second global word lines at the first moment, wherein each of the first voltages is simultaneously provided to the plurality of first global word lines;

a current detecting unit coupled to the plurality of first global word lines for measuring a plurality of first currents occurring on each of the plurality of first global word lines when the plurality of first voltages are provided to the plurality of first global word lines; and a processing unit for determining whether there are connection defects on the plurality of first global word lines according to relations between the plurality of first currents and the plurality of first voltages.

10. The memory of claim 9, wherein the processing unit is configured to determine whether there are connection defects on the plurality of first global word lines according to whether a slope of a relation curve formed by the plurality of first currents and the plurality of first voltages is higher than a predetermined slope, according to whether a deviation of the relation curve formed by the plurality of first currents and the plurality of first voltages exceeds a predetermined range, or according to whether an initial value of the relation curve formed by the plurality of first currents and the plurality of first voltages exceeds a predetermined value.

11. The memory of claim 9, wherein the plurality of first voltages are higher than the second voltage.

12. The memory of claim 9, wherein the controlling unit is further configured to stop providing power to a plurality of first sub word lines corresponding to each of the plurality of first global word lines and to a plurality of second sub word lines corresponding to each of the plurality of second global word lines.

13. The memory of claim 9, wherein the controlling unit is further configured to provide a third voltage to the plurality of first global word lines at a second moment, and to provide a plurality of fourth voltages having different voltage levels to each of the plurality of second global word lines at the second moment, wherein each of the fourth voltages is simultaneously provided to the plurality of second global word lines;

wherein the current detecting unit is further configured to measure a plurality of second currents occurring on each of the plurality of second global word lines when the plurality of four voltages are provided to the plurality of second global word lines; and wherein the processing unit is further configured to determine whether there are connection defects on the plurality of second word lines according to relations between the plurality of second currents and the plurality of fourth voltages.

14. The memory of claim 13, wherein the processing unit is configured to determine whether there are connection defects according to whether a slope of a relation curve formed by the plurality of second currents and the plurality of fourth voltages is higher than a predetermined slope, according to whether a deviation of the relation curve formed by the plurality of second currents and the plurality of fourth voltages exceeds a predetermined range, or according to whether an initial value of the relation curve formed by the plurality of second currents and the plurality of fourth voltages exceeds a predetermined value.

15. The memory of claim 13, wherein the plurality of fourth voltages are higher than the third voltage.

16. The memory of claim 9, wherein the plurality of first global word lines are a plurality of odd global word lines, and the plurality of second global word lines are a plurality of even global word lines; or
   wherein the plurality of first global word lines are a plurality of even global word lines, and the plurality of second global word lines are a plurality of odd global word lines.

17. A method of detecting connection defects in a memory, the memory comprising a plurality of first global word lines and a plurality of second global word lines, the method comprising:
   providing a plurality of first voltages having different voltage levels to each of the plurality of first global word lines at a first moment, wherein each of the first voltages is simultaneously provided to the plurality of first global word lines;
   providing a second voltage to the plurality of second global word lines at the first moment;
   measuring a plurality of first currents occurring on each of the plurality of first global word lines when the plurality of first voltages are provided to the plurality of first global word lines; and
   determining whether there are connection defects on the plurality of first global word lines according to relations between the plurality of first currents and the plurality of first voltages;
   wherein determining whether there are connection defects on the plurality of first global word lines according to the relations between the plurality of first currents and the plurality of first voltages comprises one of the following steps:
   determining whether there are connection defects on the plurality of first global word lines according to whether a slope of a relation curve formed by the plurality of first currents and the plurality of first voltages is higher than a predetermined slope;
   determining whether there are connection defects on the plurality of first global word lines according to whether a deviation of the relation curve formed by the plurality of first currents and the plurality of first voltages exceeds a predetermined range; and
   determining whether there are connection defects on the plurality of first global word lines according to whether an initial value of the relation curve formed by the plurality of first currents and the plurality of first voltages exceeds a predetermined value.

* * * * *